United States Patent [19]
Gobrecht et al.

[11] Patent Number: 4,634,495
[45] Date of Patent: Jan. 6, 1987

[54] DRY ETCHING PROCESS

[75] Inventors: Jens Gobrecht, Gebenstorf; Marco Rossinelli, Fislisbach, both of Switzerland

[73] Assignee: BBC Brown, Boveri & Company Limited, Baden, Switzerland

[21] Appl. No.: 727,429

[22] Filed: Apr. 26, 1985

[30] Foreign Application Priority Data

May 4, 1984 [CH] Switzerland ............... 2174/84

[51] Int. Cl.$^4$ ............... H01L 21/306; B44C 1/22; C03C 15/00; C03C 25/06
[52] U.S. Cl. ............... 156/643; 156/646; 156/651; 156/657; 156/659.1; 156/662; 156/667; 156/904; 204/192.32; 427/43.1; 430/313

[58] Field of Search ............... 156/643, 646, 651, 653, 156/657, 659.1, 661.1, 662, 667, 904; 252/79.1; 204/192 EC, 192 E; 427/43.1; 430/313, 316–318

[56] References Cited

U.S. PATENT DOCUMENTS

| 4,132,586 | 1/1979 | Schaible et al. | 156/904 X |
| 4,288,283 | 9/1981 | Umezaki et al. | 156/667 X |
| 4,502,916 | 3/1985 | Umezaki et al. | 156/667 X |

Primary Examiner—William A. Powell
Attorney, Agent, or Firm—Oblon, Fisher, Spivak, McClelland & Maier

[57] ABSTRACT

In a dry etching process for patterning a substrate (2), an etching mask (4) consisting of a chemically deposited oxide, for example $Al_2O_3$, is used and the etching is carried out in a fluorine-containing plasma. By this means, etching selectivities of more than 100 are achieved for a substrate (2) of silicon.

12 Claims, 6 Drawing Figures

DRY ETCHING PROCESS

The present invention is based on a dry etching process for patterning a substrate according to the preamble of claim 1. Such a process is known, for example, from the publication "IEEE Transactions on Electron Devices", Vol. ED-28, No. 11, Nov. 1981, pp. 1320–1323.

Dry etching processes, i.e. plasma and reactive ion etching techniques, have established themselves generally in microelectronic manufacturing, since they exhibit a number of advantages over the wet etching processes common previously. One of the most important advantages, especially of reactive ion etching, is the fact that the etching action in the substrate material, in this case particularly in the semiconductor material silicon, can be given a preferential direction, i.e. that anisotropic etching actions can be carried out.

This anisotropy effect is achieved by bombarding the substrate material with ions of the etching gas perpendicularly to the substrate surface. However, this has certain undesirable cathode sputtering effects associated with it, which result in an erosion of the etching mask used in the etching process.

In semiconductor manufacture, photoresist is normally used as the mask material for the etching mask in these dry etching processes. The reasons for this are the particularly easy application, patterning and removal of the photoresist after the etching. On the other hand, the desirable etching resistance of such photoresists is in particular only mediocre, especially with respect to fluorine-containing etching plasmas. The quantity which describes this relationship quantitatively is the etching selectivity, i.e. the ratio of the etch rates of the substrate material to that of the mask material, with the etch rates being expressed in material thickness removed per unit of time. The etching selectivity, for example, of silicon compared with photoresist is strongly dependent on the conditions which prevail in the plasma reactor used for the ion etching. Thus, for a plasma generated from $SF_6$ gas, etching selectivities of 1 to 50 are known.

The etching selectivities are always small if the etching process is carried out in a manner such that the etching action proceeds anisotropically, which in most cases is desirable. Such an anisotropic etching action results in etching selectivities of only 3 to 4. Similar figures also apply if $CF_4$ is used as the etching gas.

The etching selectivities mentioned are indeed adequate for etching polysilicon patterns around 1 $\mu m$ thick, so that photoresist has found a correspondingly wide application as an etching mask for dry etching processes. For the future, however, trends in semiconductor technology can be discerned which, in particular, compel etching masks with a markedly high etching resistance to be sought. The reasons for this are the ever decreasing sizes of the pattern elements in large-scale solid-state integrated circuits and the increased etching depths needed for certain components. Thus, for example, in the so-called "trench isolation technology" for integrated circuits employing CMOS technology, isolation trenches 1–2 $\mu m$ wide and around 10 $\mu m$ deep are required to isolate the individual elements of the circuit from each other. The etching of such fine and deep patterns by the dry etching process is virtually not possible if photoresist is used as the etching mask.

From the publication cited in the introduction, a reactive ion etching process is then known in which narrow and deep trenches are etched in an Si substrate by means of anisotropic etching in an $Ar/Cl_2$ plasma. In this process, etching selectivities of 50–100 are achieved for various etching mask materials if during the etching action $SiO_x$ is continuously deposited on the etching mask through the addition of $SiCl_4$ and $O_2$, so that strictly speaking the etching mask consists of a base layer of the original mask material and a layer of $SiO_x$ on top of it.

The trenches produced by the known process exhibit a troublesome, double V-shape depth profile since, as a result of the continuous deposition of $SiO_x$ on the etching mask, the mask pattern is itself continuously changed. In addition, problems arise with an undesired deposition of $SiO_2$ on the side faces of rather large patterns.

The object of the present invention is therefore to provide a dry etching process which makes it possible to produce very fine, deep and uniform structures in a substrate without additional processes proceding in the plasma reactor.

The object is achieved in a dry etching process of the type mentioned in the introduction by the features in the characterising clause of claim 1.

The oxide etching mask, for example $Al_2O_3$, which is deposited on the substrate not by cathode sputtering but by chemical means from a solution, proves in a surprising way to be extremely etch-resistant in the context of etching in a fluorine-containing plasma, so that, for a silicon substrate, etching selectivities of almost 100 are achieved in anisotropic etching actions and of several 100 in isotropic actions.

In this process, the chemical deposition of an $Al_2O_3$ layer takes place preferably through heat treatment of a layer of an aluminium chelate compound which has been spun as a solution onto the substrate rotating at high speed. In a different manner, other metal oxide layers can also be prepared, such as, for example, $TiO_2$ or $MgO$, which are also suitable as etching masks.

The invention will then be explained in more detail below by reference to the drawing using illustrative embodiments involving $Al_2O_3$ layers. In the figures FIG. 1 shows the diagrammatic representation of the spin-on step as it is applied according to a preferred illustrative embodiment of the process according to the invention to deposit the etching mask on the substrate, FIGS. 2a–e show various stages in the patterning of the substrate according to another preferred illustrative embodiment of the process according to the invention, in particular:

Figure 2A:
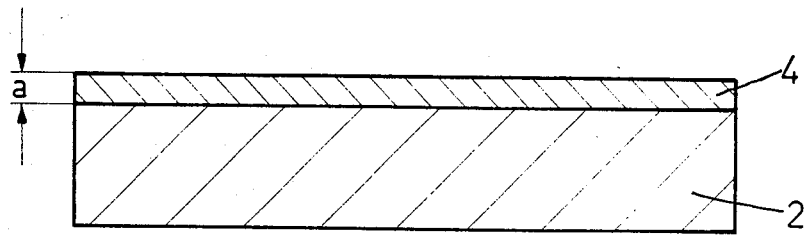
FIG. 2a shows the substrate with the etching mask applied.

The dry etching process according to the invention employs according to FIG. 2a an etching mask 4 consisting of oxide, in this case $Al_2O_3$ which is deposited on a substrate 2, preferably of silicon, by chemical means. It is particularly advantageous for producing very fine patterns to lay down the etching mask 4 with a mask thickness a of 50–500 nm, preferably of 100–200 nm.

Figure 1:
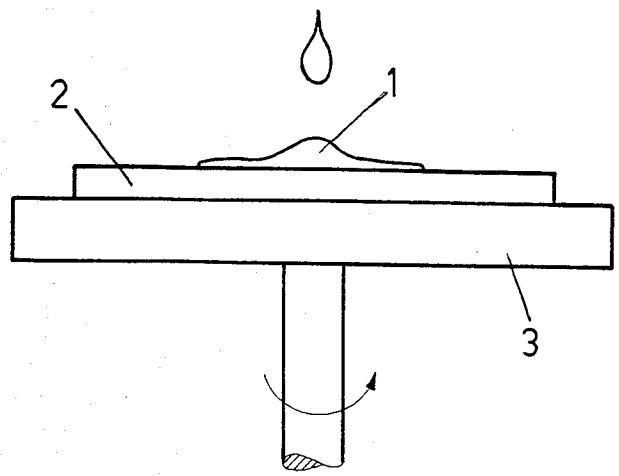

According to a preferred illustrative embodiment employing a metal oxide layer of $Al_2O_3$, the chemical deposition takes place through a sol-gel process involving heat treatment from an organic aluminium chelate compound which according to FIG. 1 is deposited as aluminium chelate solution 1 by spinning onto the substrate 2 in a so-called "spin-on" process, the substrate being fixed on a spinning device 3 and rotated with a speed of several 1000 rpm. Data on various organic aluminium compounds suitable for this process can, for example, be obtained from U.S. Pat. Ser. No. 4,040,083.

EXAMPLE

To prepare an $Al_2O_3$ etching mask with a mask thickness of around 110 nm, the procedure is as follows: a suitable aluminium chelate compound is converted into a 20% solution using a solvent agent consisting of equal parts of ethanol and toluene. The aluminium chelate solution is spun onto a Si substrate in slice form at 3000 rpm. Then hydrolysis follows for between approximately 10 minutes and 5 hours, depending on the thickness of layer, at room temperature in normal air, and then a short annealing lasting about 30 minutes under an infrared lamp. Finally the substrate with the applied layer is pre-baked in the oven in an oxygen atmosphere for about 1 hour at 60° C. and finally annealed for about 1 hour at 350° C. The $Al_2O_3$ etching mask is then ready and has a thickness of approximately 115 nm.

Figure 2B:
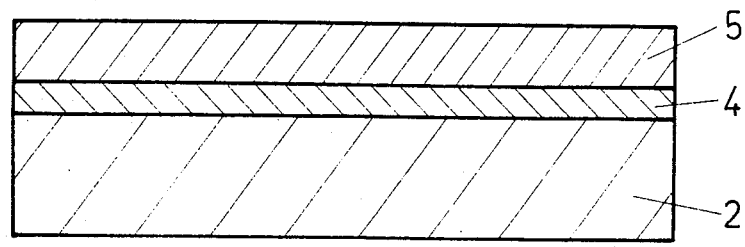
FIG. 2b shows an arrangement of substrate and etching mask provided with a photoresist layer.

To pattern the etching mask 4, a photoresist layer 5 is applied to the etching mask 4 according to FIG. 2b, positive-acting photoresist with an alkali developer being used for preference, as is known from the standard patterning processes of semiconductor technology. The application of the photoresist layer 5 is also carried out by means of the "spin-on" process already described so that the two process steps of etch mask and photoresist layer preparation can be carried out in the same spinning device 3.

Figure 2C:
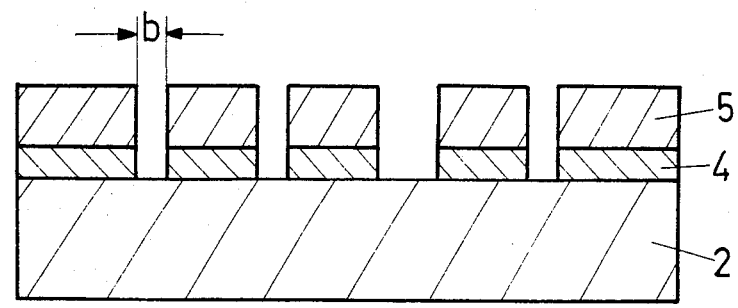
FIG. 2c shows the arrangement from FIG. 2b after the exposure and development steps.

After drying the photoresist layer 5, the arrangement in FIG. 2b is exposed using the normal mask techniques, with the photoresist layer 5 being exposed over predetermined areas corresponding to the predetermined structure of the photomask. In a surprising manner, in the subsequent development process using the alkali developer, not only the exposed photoresist is dissolved, but also the $Al_2O_3$ layer at those places where it is exposed to the developer, so that already as a result of the development step alone a completely patterned etching mask 4 according to FIG. 2c is produced. In addition, after hardening the photoresist by baking, an etching in hot (50°–100° C.) phosphoric acid can also be carried out if in the case of rather thick $Al_2O_3$ layers the development process is not adequate for removing the $Al_2O_3$ at the exposed places.

Figure 2D:
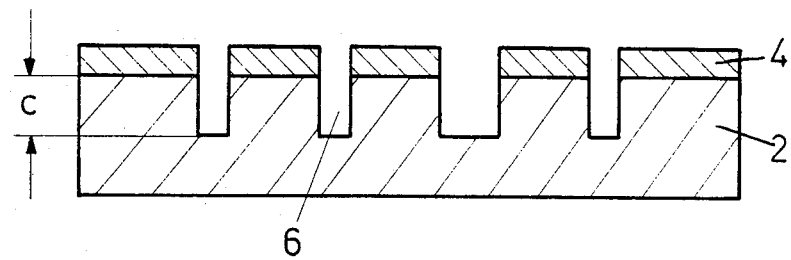
FIG. 2d shows the anisotropically etched substrate.
Figure 2E:
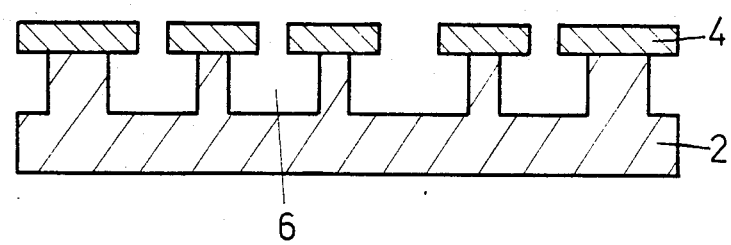
FIG. 2e shows the isotropically etched substrate.

The subsequent dry etching in the fluorine-containing plasma of a plasma reactor produces according to FIGS. 2d and 2e etching trenches 6 with a precisely defined etching depth c in the substrate 2. If the process is carried out anisotropically, as depicted in FIG. 2d, the width of the etching trenches 6 is virtually equal to the etching width b predetermined by the etching mask 4. If the process is carried out isotropically, on the other hand, considerably larger trench widths result, as shown in FIG. 2e, as a result of the underetching of the etching mask 4.

EXAMPLE

The Si substrate is etched anisotropically in the $SF_6$ plasma under the following conditions:

| | |
|---|---|
| HF power density: | 0.5 W/cm$^2$ |
| $SF_6$ flowrate: | 2 sccm |
| Pressure: | 50 ubar |

When the process is carried out in this way, the etching rate of the Si substrate is 367 nm/min, that of the $Al_2O_3$ mask only 3.86 nm/min, i.e. the etching selectivity reaches the amazingly high value of 95 for the anisotropic etching action.

As the pattern for an etching under the conditions specified in the example, a ruled grating consisting of 50 $\mu$m-wide stripes and 30 $\mu$m-wide trenches was used in the experiment; perpendicular to this there was a very narrow trench approximately 2 $\mu$m wide. It was possible to etch all the trenches uniformly to a depth of approximately 11 $\mu$m under the conditions cited, without a detectable underetching of the $Al_2O_3$ etching mask occurring.

In an isotropic execution of the process tried out in another experiment, the removal of the $Al_2O_3$ layer on reaching an etching depth of 9 $\mu$m could not be measured, so that for the isotropic etching action etching selectivities of even several 100 must be assumed.

Finally it should be pointed out that the residues of the photoresist layer 5 left after development can either be washed off before the etching process by means of suitable solvents or can be removed in the etching process itself. Equally, the residues of the $Al_2O_3$ etching mask can easily be removed after the etching in warm phosphoric acid.

Of course, if for example larger etching depths are required, $Al_2O_3$ etching masks with a greater mask thickness a can also be prepared, for which purpose either an aluminium chelate solution of higher percentage is used or the process step of spinning on the aluminium chelate layer is repeated several times.

Of course, the mask material is not limited to the $Al_2O_3$ of the illustrative embodiments. Using the "sol-gel process" mentioned, a multiplicity of glass-like oxide layers can be applied on the semiconductor substrates from solutions by spinning-on or by dipping. As well as $Al_2O_3$, it is possible to use the oxides of the elements Ti, Zr, Hf, B, the rare earths, and also mixtures of these oxides.

The important point is that the applied layer permits patterning and is chemically stable towards fluorine-containing gas plasmas, which is the case for the oxides of the elements named to varying degrees.

As starting substances for the preparation of the solution, organic compounds such as acetyl acetonates, chelate compounds and alcoholates are particularly suitable.

All in all, the dry etching process according to the invention represents a process for patterning substrates in which fine and very deep patterns can be prepared with a uniform depth profile in a very simple way and which is in particular suitable even for the mass production of semiconductor components.

We claim:

1. A dry etching process for patterning a substrate (2), which comprises depositing an $Al_2O_3$ layer as an inorganic etching mask (4) on a substrate (2), wherein said layer is deposited on said substrate (2) as a solution dissolved in an organic compound by dipping the substrate (2) in the solution or by spinning the solution onto the substrate (2), and patterning said substrate by exposing predetermined areas of said etching mask (4) and the surface of aaid substrate (2), and removing the material of said substrate in said predetermined areas by an ion etching process, wherein said ion etching process is carried out in a fluorine-containing plasma.

2. A dry etching process according to claim 1, wherein the oxide layer is used in a mask thickness (a) of 50–500 nm.

3. A dry etching process according to claim 2, wherein said mask thickness is 100–200 nm.

4. A dry etching process according to claim 1, wherein $SF_6$ gas with a flow rate of about 2 sccm is used at a pressure of about $50\mu$ bar and an HF power density of approximately $0.5 W/cm^2$ for the ion etching process.

5. A dry etching process according to claim 1, wherein said $Al_2O_3$ layer is prepared by thermal decomposition of an organic aluminum compound which is first dissolved in an organic solvent, spun onto the substrate (2) which is rotating at a speed of several 1000 rpm, and the relevant layer is annealed at a temperature above 300° C. for more than 10 min.

6. A dry etching process according to claim 5, wherein the layer containing the organic aluminum compound and spun onto the substrate (2) is first left in air at room temperature for several minutes before annealing, then irradiated with an infrared lamp for about 30 minutes and finally pre-baked in an inert gas atmosphere for about 1 hour at 60° C.

7. A dry etching process according to claim 5, wherein the organic aluminum compound is used in an approximately 20% solution for spinning on.

8. A dry etching process according to claim 5, wherein said organic aluminum compound is an aluminum chelate compound.

9. A dry etching process according to claim 5, wherein said organic solvent is a mixture of equal parts of ethanol and toluene.

10. A dry etching process according to claim 5, wherein said rotating speed is around 3000 rpm.

11. A dry etching process according to claim 1, wherein a photoresist layer (5) is deposited on the etching mask (4) for the patterning process, exposed in the predetermined areas and then again removed from these areas by a subsequent development process, and the photoresist is baked hard after termination of the development process and the substrate (2) with its etching mask (4) is dipped in warm phosphoric acid, and wherein the photoresist layer (5) is deposited on the rotating etching mask (4) by spinning on.

12. A dry etching process according to claim 1, wherein etching masks (4) of greater thickness are prepared by depositing individual layers of the organic compound several times in sequence.

* * * * *